United States Patent [19]

Tanji et al.

[11] Patent Number: 4,913,652
[45] Date of Patent: * Apr. 3, 1990

[54] PYROLYTIC BORON NITRIDE CRUCIBLE AND METHOD FOR PRODUCING THE SAME

[75] Inventors: Hiroaki Tanji, Tokyo; Masaharu Suzuki, Machida, both of Japan

[73] Assignee: Denki Kagaku Kogyo Kabushiki Kaisha, Tokyo, Japan

[ * ] Notice: The portion of the term of this patent subsequent to Sep. 27, 2005 has been disclaimed.

[21] Appl. No.: 319,902

[22] Filed: Mar. 3, 1989

Related U.S. Application Data

[63] Continuation of Ser. No. 216,589, Jul. 7, 1988, abandoned, which is a continuation of Ser. No. 866,823, May 22, 1986, Pat. No. 4,773,852.

[30] Foreign Application Priority Data

Jun. 11, 1985 [JP]  Japan .................................. 63-125230
Jun. 11, 1986 [JP]  Japan .................................. 63-125231

[51] Int. Cl.⁴ ........................................... F27B 14/00
[52] U.S. Cl. ..................... 432/156; 432/248; 432/263; 432/264
[58] Field of Search ............... 432/156, 157, 248, 252, 432/262-265

[56] References Cited

U.S. PATENT DOCUMENTS

| | | | |
|---|---|---|---|
| 559,868 | 5/1896 | Scoville | 432/156 |
| 1,803,135 | 4/1931 | Ross | 432/263 |
| 1,996,660 | 4/1935 | Stanworth et al. | 432/156 |
| 2,291,083 | 7/1942 | Jung | 432/156 |
| 2,721,364 | 10/1955 | Tretheway et al. | 432/156 |
| 2,947,114 | 8/1960 | Hill | 432/264 |
| 3,148,238 | 9/1964 | Willenbrock, Jr. | 432/248 |
| 3,181,845 | 5/1965 | Malin et al. | 432/157 |
| 3,328,017 | 6/1967 | Conner | 432/264 |
| 3,345,059 | 10/1967 | Swindt | 432/264 |
| 3,491,992 | 1/1970 | Recihelt | 432/264 |
| 3,734,480 | 7/1973 | Zanis | 432/264 |
| 3,779,699 | 12/1973 | Russell et al. | 432/248 |
| 3,986,822 | 10/1976 | Lashway | 432/264 |
| 4,005,391 | 10/1977 | Schmidt et al. | 432/265 |
| 4,005,982 | 2/1977 | Palz et al. | 432/248 |
| 4,528,163 | 7/1985 | Albrecht | 432/264 |

Primary Examiner—Henry C. Yuen
Attorney, Agent, or Firm—Jordan and Hamburg

[57] ABSTRACT

A pyrolytic boron nitride crucible is provided. The crucible contains at least five wall layers consisting of first and second wall layers. The thickness of each of the first wall layers is 5 to 100 microns and the thickness of each of the second wall layers is 1/50 to 1/1 of that of the first wall layer. The total thickness of the entire wall layers is 0.5 to 3 mm. The first wall layer is bonded to and laminated alternately with the second wall layer.

2 Claims, 1 Drawing Sheet

PYROLYTIC BORON NITRIDE CRUCIBLE AND METHOD FOR PRODUCING THE SAME

This application is a continuation of application Ser. No. 216,589, filed July 7, 1988, abandoned, which in turn is a continuation of Ser. No. 866,823, filed May 22, 1986, now U.S. Pat. No. 4,773,852.

BACKGROUND OF THE INVENTION

1. Field of the Invention

The present invention relates to a pyrolytic boron nitride crucible and a method for producing the same, and particularly to a pyrolytic boron nitride crucible used in the Molecular Beam Epitaxy method or the Liquid Encapsulated Czochralski method for melting therein a metal or a compound and a method for producing such a crucible.

2. Related Art Statement

Pyrolytic boron nitride is high grade boron nitride of high purity and used for wide applications including the production of compound semiconductors and special alloys. Particularly, in the production of a compound semiconductor such as GaAs the excellent anticorrosive property and the high purity of the pyrolytic boron nitride are effectively utilized for the growth of a single crystal of a compound semiconductor containing little impurities and superior in electrical properties. For example, in the process for growing a GaAs single crystal, the pyrolytic boron nitride is used for a material for a crucible in the Liquid Encapsulated Czochralski method and is also used for a material for a boat in the horizontal Bridgeman technique. Moreover, the pyrolytic boron nitride is almost exclusively used for a material for a crucible in which a metal is melted in the Molecular Beam Epitaxy method, which is a method for growing epitaxitially a mixed crystalline compound semiconductor, such as $Ga_{1-x}Al_xAs$ on a wafer made of a single crystal of GaAs.

Such pyrolytic boron nitride has been produced through the so-called chemical vapor deposition method, as disclosed by U.S. Pat. No. 3,152,006, wherein a boron halide, such as boron trichloride ($BCl_3$) and ammonia are used as gaseous starting materials to deposite boron nitride at a temperature of from 1450° to 2300° C. and at a pressure of not more than 50 Torr on the surface of an appropriate substrate. Then, the deposited pyrolytic boron nitride is separated or released from the substrate to obtain an article made of self-standing pyrolytic boron nitride. The thus obtained pyrolytic boron nitride has a structure wherein the C-planes of the hexagonal crystal lattices are oriented in the direction perpendicular to the growth direction of the deposited wall layer, and thus the properties thereof are exceedingly anisotropic. The pyrolytic boron nitride has a high mechanical strength in the direction parallel to the surface of the wall layer, but the mechanical strength thereof along the crystal growth direction is not so high that the formed wall layer tends to be exfoliated along the growth or deposition direction. Such a tendency of exfoliation along the deposition direction is a main cause for reducing the lifetime of a crucible made of pyrolytic boron nitride when used repeatedly. Problems involved in the conventional crucibles used in the Liquid Encapsulated Czochralski method and the Molecular Beam Epitaxy method will be described in detail hereinbelow.

A sinble crystal rod of a compound semiconductor, such as GaAs or InP, has been predominantly produced through the Liquid Encapsulated Czochralski method comprising the steps of melting the aforementioned compound or materials for the compound in a crucible made of pyrolytic boron nitride, covering the upper surface of the mass with molten $B_2O_3$ liquid of high purity to be encapsulated, dipping a seed crystal of the compound in the molten mass of the compound, and then pulling up the seed crystal slowly from the molten mass to form a single crystal rod of the compound. After the completion of pulling up the single crystal, the crucible must be cooled to room temperature and the cooled and solidified $B_2O_3$, which has served as the encapsulator and is now adhering on the interior periphery of the crucible, must be removed prior to repeated use. However, in the operation of removing the solidified $B_2O_3$, portions of the pyrolytic boron nitride layer are frequently peeled off from the interior surface of the crucible together with the $B_2O_3$. It is an extremely rare case where peeling of the pyrolytic boron nitride layer occurs uniformly over the interior wall of the crucible, and it frequently occurs that a portion of the interior wall of the crucible is peeled off and the peeled fragment has a random thickness. In the most serious case, such a local peeling extends to the exterior peripheral surface of the crucible to result in breakdown of the crucible. Even when the defect caused by peeling is not so great in depth, the interfaces between the adjacent boron nitride wall layers contact with the molten mass so that trace impurities contained in the molten mass are collected in the interfaces. Such locally collected or concentrated impurities cause disadvantages in that the impurities are released in the molten mass at a later operation cycle or a further peeling propagates from such a location. In order to exclude such disadvantages, it is required to remove the interior wall layer until a smooth periphery is formed at the depth of the deepest defect caused by peeling. However, in this operation of forming a smooth interior periphery, a deeper defect is apt to be formed by peeling. For these reasons, the wall of the crucible becomes thinner as it is repeatedly used for growing therein a semiconductor crystal, although it is not broken due to a single peeling. As a result, the lifetime of the conventional crucible has been used up after several to ten time usages thereof.

When the pyrolytic boron nitride is used as a material for a crucible used in the Molecular Beam Epitaxy method and a metal having good wettability with the pyrolytic boron nitride, such as aluminum, is melted therein, the crucible is cooled at the time of stopping the Molecular Beam Epitaxy system, whereupon a severe stress is applied on the crucible due to tremendous differences in thermal expansion coefficients between the crucible and the metal contained therein. Since the cooled and solidified metal adheres firmly to the interior wall surface of the crucible, because of good wettability of the metal with the crucible, the crucible is often broken by the stress.

In order to solve the aforementioned problems, a multi-walled crucible having a thick outer wall layer for providing integrity of the whole structure, an intermediate wall layer and an innermost wall layer, which layers have thin thicknesses and are weakly bonded to the outer layer, has been proposed, for example by U.S. Pat. Nos. 3,986,822 and 4,058,579, and commercially sold. Although such a multi-walled crucible is successfully used as a crucible for melting a metal in the Molecular Beam Epitaxy method, the metal contained therein oozes toward the outside of the interior wall layer to make further use thereof impossible once the innermost layer has been damaged, as has been clearly described in the technical information by Union Carbide Co., U.S.A. The conventional multi-walled crucibles have been produced by a cumbersome and time-consuming process including the steps of depositing one wall layer, interrupting the deposition reaction by cooling, and then re-starting the deposition reaction by raising the temperature to the deposition temperature.

OBJECTS AND SUMMARY OF THE INVENTION

A primary object of this invention is to provide a pyrolytic boron nitride crucible which can be used repeatedly for a number of times and has an extremely long lifetime, and to provide a method for producing the same.

Another object of this invention is to provide a pyrolytic boron nitride crucible which is particularly suited for melting therein a metal or a compound in the Molecular Beam Epitaxy method and in the Liquid Encapsulated Czochralski method, and to provide a method for producing the same.

A further object of this invention is to provide a pyrolytic boron nitride crucible which may be produced at a high production efficiency and at a low cost through a method which does not include the step of interrupting the deposition operation, and to provide a method for producing the same.

The above and other objects of this invention will become apparent from the following detailed description of the invention.

According to the invention, there is provided a pyrolytic boron nitride crucible having a multi-walled structure comprising at least five wall layers, the thickness of each of first wall layers being 5 to 100 microns, the thickness of each of second wall layers being 1/50 to 1/1 of that of the first wall layer, the total thickness of the entire wall layers being 0.5 to 3 mm, and the first wall layer being bonded to and laminated alternately with the second wall layer, whereby the peeling of one wall layer is prevented from affecting the other wall layers so that the peeling of one wall layer is not propagated into the adjacent layer.

According to a further aspect of this invention, there is provided an improvement in the method for producing a pyrolytic boron nitride crucible having a multi-walled structure comprising at least five wall layers bonded to and laminated with alternately with one another, the thickness of each wall layer being 5 to 100 microns, and the total thickness of the entire wall layers being 0.5 to 3 mm through repeated chemical vapor deposition steps using a boron halide gas and an ammonia gas as the starting materials, the improvement which comprises the step of forming a first wall layer at a deposition rate of 10 to 150 microns per hour, and the step of forming a second wall layer at a deposition rate of 1.5 to 5 times that of the step for forming the first wall layer, the step of forming the first layer and the step of forming the second layer being repeated alternately.

According to a still further aspect of the invention, there is provided an improvement in the method for producing a pyrolytic boron nitride crucible having a multi-walled structure comprising at least five wall layers, the thickness of each of first wall layers being 20 to 100 microns, the thickness of each of second wall layers being 1/50 to 1/2 of that of the first wall layer, the total thickness of the entire wall layers being 0.5 to 3 mm, and the first wall layer being bonded to and laminated alternately with the second wall layer through repeated chemical vapor deposition steps using a boron halide gas and an ammonia gas as the starting materials, the improvement which comprises the step of forming the first wall layer by maintaining the molar ratio of ammonia to boron halide in the starting gas mixture within the range of from 2 to 10, and the step of forming the second wall layer by maintaining the molar ratio of ammonia to boron halide in the starting gas mixture within the range of from not less than 1/3 to less than 2, the step of forming the first layer and the step of forming the second layer being repeated alternately.

BRIEF DESCRIPTION OF THE DRAWING

The invention will be better understood by reference to the accompanying drawing, which is a cross-sectional view showing a pyrolytic boron nitride crucible having a multi-walled structure according to the invention.

DESCRIPTION OF THE INVENTION

Figure 1:
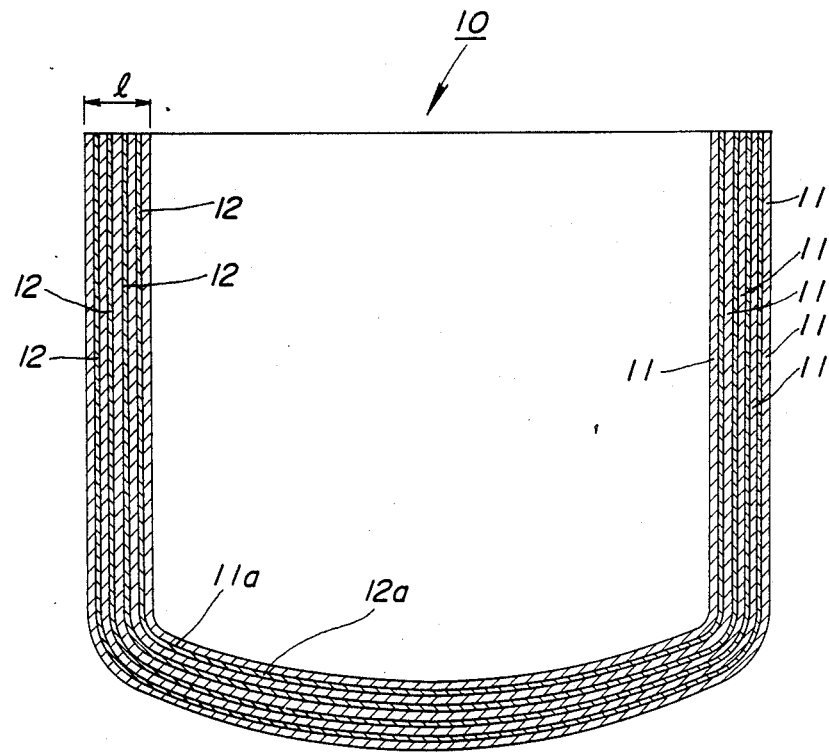

The present invention will now be described more in detail.

The pyrolytic boron nitride crucible having the multi-walled structure, according to this invention, have a plurality of first wall layers, eahh of which should have a thickness of from 5 to 100 microns, preferably from 20 to 100 microns. If the thickness of each first wall layer is less than 5 microns, the individual wall layers are not distinguishably saparated with each other to lose the merit of the multi-walled structure. On the contrary, if the thickness of each first wall is more than 100 microns, spontaneous delamination occurs at the interfaces of the adjacent wall layers due to the stress developed in-between the wall layers, leading to disadvantages such that impurities are trapped in the interfaces of adjacent wall layers.

Each of the second layers should have a thickness of 1/50 to 1/1, preferably 1/50 to 1/2, of that of each adjacent first wall layer. If the thickness of each second wall layer 12 is less than 1/50 of that of the first wall layer 11, the merit of the multi-walled structure is not exhibited. On the contrary, if the thickness of each second wall layer 12 is more than 1/1 of that of the first wall layer 11, delamination occurs at the interfaces between the first and second wall layers 11, 12. Total thickness l of the entire wall layers should be within the range of from 0.5 to 3 mm. If the total wall thickness l is less than 0.5 mm, the strength of the crucible 10 is insufficient, whereas spontaneous delamination occurs due to the increase of internal stress if the total wall thickness l exceeds 3 mm.

The multi-walled crucible of the invention has a lifetime which is remarkedly longer than those of the conventional pyrolytic boron nitride crucibles. The crucible of the invention, when used as a crucible in the Liquid Encapsulated Czochralski method, will now be described. Since the crucible 10 of the invention has a number of pyrolytic boron nitride wall layers 11, 12 bonded, preferably weakly bonded, with each other, even if the inner pyrolytic boron nitride wall layer 11a is peeled off during the step of removing $B_2O_3$ after the completion of growth of the crystal by the Liquid Encapsulated Czochralski method, peeling is selectively initiated only at the interface between the adjacent wall layers 11a, 12a because of the fact that the bonding force at the interface of adjacent wall layers 11a, 12a is intentionally designed to be weaker than the internal portions of each wall layer. In addition, the peeling is propagated only along the interface of adjacent wall layers 11a, 12a, and increase in thickness of the exfoliated fragment, otherwise found in the conventional pyrolytic boron nitride crucible, along with the propagation of peeling does not take place. By the provision of the first wall layers 11 each having a thickness of from 5 to 100 microns, peeling occurs always at the innermost wall layer 11a of the crucible 10 and not found at the interstices between the other multiple pyrolytic boron nitride wall layers, although the reason therefor has not been made clear. Since the peeling caused at the step of removing $B_2O_3$ takes place always at the innermost wall layer 11a and the peeling is not propagated into the adjacent layer, the exfoliated layer may be removed without affecting the adjacent layer. As a result, the lifetime of the crucible 10 is prolonged remarkably, and the scattering in lifetime of individual crucibles is little.

When the crucible 10 of the invention is used for melting therein a metal in the Molecular Beam Epitaxy method, the innermost pyrolytic boron nitride wall layer 11a adheres firmly with the solidified metal at the cooling step, thereby being applied with an inward tension stress. However, according to the present invention, since each of the wall layers 11, 12, including the innermost wall layer 11a, is as thin as 100 microns at the thickest to have some flexibility and only weakly bonded to the outside wall layer, the innermost layer 11a adhering to the metal is separated slightly from the adjacent wall layer 12a to be shrunk without being broken. Even if the innermost wall layer 11a is broken and the molten metal penetrates in between the adjacent wall layers 12a, there is left a number of pyrolytic boron nitride wall layers 11, 12 having similar properties as those of the innermost wall layer 11a around the periphery of the innermost wall layer. Accordingly, the crucible 10 of the invention can be used repeatedly even after the innermost wall layer 11a has been peeled off. The pyrolytic boron nitride crucible 10 of the invention can, thus, be used repeatedly more and more times as compared with prior art crucibles.

The method of producing the pyrolytic boron nitride crucible, according to the invention, will now be described.

Each of the wall layers forming the multi-walled pyrolytic boron nitride crucible may be deposited by a chemical vapor deposition or chemical vapor growth technique while using a boron halide gas, such as boron trichloride gas, and an ammonia gas as the starting gaseous materials. It is desirous that the pressure in the chemical vapor deposition step ranges within 0.5 to 5 Torr and the temperature at the step is maintained within 1850° to 1950° C. If the pressure is less than 0.5 Torr, decomposition of pyrolytic boron nitride is activated, whereas application of a pressure of higher than 5 Torr is not preferred since fine particles of boron nitride are formed by the side reaction so that the fine particles are introduced in the pyrolytic boron nitride wall layer to impair the uniformity of the resultant structure. If the chemical vapor deposition step is carried out at a temperature of lower than 1850° C., the strength of the formed pyrolytic boron nitride is lowered so as not to form a crucible withstanding practical use. On the contrary, if the chemical vapor deposition step is carried out at a temperature of higher than 1950° C., pyrolytic boron nitride reacts with carbon constituting the substrate and is converted into $B_4C$ which induces a disadvantageous result in that the content of impurity carbon is increased in the pyrolytic boron nitride. The most preferred pressure ranges from 0.75 to 3 Torr, and the most preferred temperature range is from 1900° to 1940° C.

In a first embodiment of the method of producing a boron nitride crucible having the multi-walled structure with the wall layers being weakly bonded, according to the invention, each of the layers having a thickness of 5 to 100 microns and bonded with one another to form the pyrolytic boron nitride crucible having at least five wall layers should be deposited at a deposition rate (or layer growing rate) which is different from that for the deposition of the adjacent layer. For this purpose, the first wall layer is deposited at a deposition rate of 10 to 150 microns per hour, and the second wall layer adjacent to the first wall layer is deposited at a deposition rate of 1.5 to 5 times that for the deposition of the first wall layer, the step for depositing the first wall layer and the step for depositing the second layer being repeated alternately.

The deposition rate for depositing the second wall layer is set to 1.5 to 5 times as high as that for depositing the first layer for the following reasons. If the deposition rate for depositing the second wall layer is less than 1.5 times that for depositing the first layer, the bonding force between the adjacent wall layers is not significantly differentiated from the bonding strength internally of a continuous wall layer which has been formed at a constant deposition rate, thus failing to attain the object of the invention for the provision of a multi-walled structure. If the difference in deposition rate is greater than 5 times, the bonding force between the adjacent wall layers becomes too low to cause spontaneous delamination at the interfaces of the wall layers in the crucible. It is desirous that the deposition rate of a wall layer be not more than 750 microns per hour at the greatest, since the mechanical strength of a pyrolytic boron nitride wall layer is lowered extremely when the deposition rate is set to a level of more than 750 microns per hour. Accordingly, the deposition rate for depositing the first wall layer, which should be within the range of 1/1.5 to 1/5 of that for depositing the second layer, may be not more than 150 microns per hour as a natural consequence. It is preferred that the first wall layer is deposited at a deposition rate of not less than 10 microns per hour, in order to obviate unnecessary prolongation of the time required for forming one crucible. Preferable conditions for producing a crucible having a satisfactory quality at an acceptable production efficiency are that the first wall layer is formed at a deposition rate of from 50 to 150 microns per hour and that the second wall layer is formed at a deposition rate of from 75 to 250 microns per hour.

Although the first and second wall layers should be deposited alternately one after another for producing a crucible of the invention, interruption of operation for shifting the deposition condition from that for the first wall layer to that for the second wall layer is not necessary, and the shift or change of deposition condition may be effected continuously without the need of standstill time. Accordingly, the crucible of the invention can be produced within a time substantially the same as that required for the production of a conventional single wall crucible.

In order to shift the deposition rate at the steps of forming, respectively, the first and second wall layers, various parameters affecting the deposition rate in the ordinary chemical vapor deposition method may be changed at certain time intervals. For example, the concentrations of the starting gases introduced in the chemical vapor deposition reaction chamber or the flow rates of the gases flowing over the substrate may be changed by changing the compositions of the gases, or by varying the flow rate of the gases or the pressure in the reaction chamber at certain intervals.

In a second embodiment of the method of producing a boron nitride crucible having the multi-walled structure, according to the invention, wherein each of the first wall layers has a thickness of 20 to 100 microns and each of the second wall layers has a thickness of 1/50 to 1/2 of that of the first layer, each of the first wall layers being weakly bonded to and laminated alternately with each of the second wall layers, the molar ratio of ammonia to boron halide for depositing each first wall layer is differentiated from that for depositing each second wall layer. In this second embodiment of the method of the invention, each of the first wall layers providing the main structural integrity of the crucible should be deposited while maintaining the molar ratio of ammonia to boron halide within the range of from 2 to 10. If the molar ratio of ammonia to the boron halide is less than 2, the formed pyrolytic boron nitride is not sufficiently flexible and is easily broken. If the molar ratio of ammonia to boron halide is more than 10, a large amount of by-product ammonium chloride is formed with attendant problems which pose difficulty in operation. Each of the second wall layers (intermediate wall layers) which serve to bond the adjacent first wall layers should be deposited while maintaining the molar ratio of ammonia to boron halide within the range of not less than 1/3 and less than 2. If the molar ratio is more than 2, the bonding force between the first and second wall layers becomes too strong to cause disadvantageous peeling of plural wall layers. If the molar ratio is less than 1/3, pyrolytic boron nitride is not formed to deteriorate the anticorrosive property of the formed second wall layer.

A pyrolytic boron nitride crucible having a good quality may be produced, for example, by a method comprising the first step of depositing a first wall layer using a composition containing ammonia and boron halide in a molar ratio of 2.5 to 4.5 to have a thickness of from 25 to 50 microns and the second step of depositing a second wall layer using a composition containing ammonia and boron halide in a molar ratio of 1 to 1.5 to have a thickness of from 5 to 10 microns, the first and second steps being repeated alternately until the total wall thickness reaches 0.9 to 1.5 mm. Since it is not necessary to interrupt the deposition operation at the time of shifting the condition from that for the deposition of the first wall layer to that for the deposition of the second wall layer, and vice versa, a crucible can be produced without any unnecessary prolongation of the time required for the production.

EXAMPLES OF THE INVENTION

The present invention will be described more specifically with reference to some Examples and Comparative Examples.

Examples 1 to 5 and Comparative Examples 1 to 5

Using eight graphite plates each having the dimensions of 50 cm (width)×60 cm (length)×1 cm (thickness), a reaction chamber having an octagonal cross section was formed on a graphite plate (bottom plate) having a diameter of 20 cm. A 5 cm diameter hole was provided at the center of the bottom plate for introducing therethrough gases. Two graphite pipes, one having an outer diameter of 5 cm and the other having an outer diameter of 2.5 cm, coated preliminarily with pyrolytic boron nitride were connected coaxially to the hole of the bottom plate. A graphite substrate having a diameter of 5 cm and a length of 6 cm was suspended in the upper portion of the reaction chamber. The reaction chamber was put into a vacuum furnace heated to a high temperature by resistance heating, and the graphite inner and outer pipes of the starting gas inlet conduit were connected with stainless steel gas conduits for feeding, respectively, an $BCl_3$ gas and a $NH_3$ gas.

The furnace was evacuated to an order of $10^{-3}$ Torr and heated to 1900° C., and then pyrolytic boron nitride crucibles each having a total wall thickness of 1 mm. were produced at a pressure of 1 Torr and under the conditions as set forth in Table 1. The deposition rate was changed by varying the concentrations of the starting gases. Each of the thus produced crucibles was subjected to the following lifetime test which was conducted to simulate the operations for growing a single crystal by the Liquid Encapsulated Czochralski method.

50 g of $B_2O_3$ was put into an crucible and heated to 1280° C. in $N_2$ atmosphere to melt $B_2O_3$, and then cooled to the room temperature. The crucible was dipped in methanol and rinsed by subjecting the same to ultrasonic wave oscillation for 20 to 40 minutes to remove $B_2O_3$ adhering to the interior wall surface of the crucible. Portions of the inner peripheral wall of each crucible adhering to shrunk $B_2O_3$ were peeled off upon cooling of the crucible. The aforementioned simulation test cycle was repeated until the crucible had been broken. The number of test cycles conducted until each crucible had been broken is shown in Table 1. A commercially available crucible (Comparative Example 5) was subjected to a similar test.

TABLE 1

| | First Wall Layer | | Second Wall Layer | | |
|---|---|---|---|---|---|
| Run No. | Deposition Rate (micron/hr) | Thickness (micron) | Deposition Rate (micron/hr) | Thickness (micron) | Lifetime of Crucible |
| Example 1 | 10 | 50 | 15 | 50 | 32 cycles |
| Example 2 | 100 | 30 | 500 | 30 | 28 cycles |
| Example 3 | 50 | 100 | 150 | 100 | 24 cycles |
| Example 4 | 50 | 5 | 150 | 5 | 26 cycles |
| Example 5 | 50 | 50 | 150 | 50 | 36 cycles |
| Com. Ex. 1 | 160 | 105 | 800 | 105 | 3 cycles |
| Com. Ex. 2 | 50 | 120 | 150 | 120 | Delaminated at the initial stage |

TABLE 1-continued

| Run No. | First Wall Layer Deposition Rate (micron/hr) | Thickness (micron) | Second Wall Layer Deposition Rate (micron/hr) | Thickness (micron) | Lifetime of Crucible |
|---|---|---|---|---|---|
| Com. Ex. 3 | 50 | 105 | 60 | 105 | 15 cycles |
| Com. Ex. 4 | 50 | 3 | 150 | 4 | 16 cycles |
| Com. Ex. 5 | Commercially Available Crucible (Single Wall Structure) | | | | 15 cycles |

Each of the crucibles of the present invention had a lifetime of more than 20 cycles, and exhibited a longer life as compared with those of the Comparative Examples.

Examples 6 and Comparative Examples 6 and 7

Pyrolytic boron nitride crucibles each having a diameter of 3.49 cm and a height of 4.13 cm were produced. Each of the first wall layers was formed at a deposition rate of 50 microns/hr to have a thickness of 50 microns, and each of the second wall layers was formed at a deposition rate of 150 microns/hr to have a thickness of 50 microns. Ten crucibles (Example 6) were produced under the aforementioned conditions. Ten double-wall crucibles (Comparative Example 6) each having a 0.4 mm thick inner wall layer and a 0.6 mm thick outer wall layer were produced. Ten single-wall crucibles (Comparative Example 7) each having a 1 mm thick single wall layer were produced. Each of the thus produced crucibles was subjected to a lifetime test which was conducted by melting 20 cc of aluminum therein and then cooling the same. All ten crucibles of Example 6 showed lifetimes of more than 8 cycles. In contrast thereto, six crucibles of Compartive Example 6 were broken by 3 cycles, and all crucibles of Comparative Example 6 had been broken at the seventh cycle. Nine crucibles of Comparative Example 7 were broken at the first cycle, and the remaining one crucible was broken at the second cycle.

Examples 7 to 11 and Comparative Examples 8 to 12

Using eight graphite plates each having the dimensions of 50 cm (width)×60 cm (length)×1 cm (thickness), a reaction chamber having an octagonal cross section was formed on a graphite plate (bottom plate) having a diameter of 20 cm. A 5 cm diameter hole was provided at the center of the bottom plate for introducing therethrough gases. Two graphite pipes, one having an outer diameter of 5 cm and the other having an outer diameter of 2.5 cm, coated preliminarily with pyrolytic boron nitride were connected coaxially to the hole of the bottom plate. A graphite substrate having a diameter of 5 cm and a length of 6 cm was suspended in the upper portion of the reaction chamber. The reaction chamber was put into a vacuum furnace heated to a high temperature by resistance heating, and the graphite inner and outer pipes of the starting gas inlet conduit were connected with stainless steel gas conduits for feeding, respectively, a $BCl_3$ gas and an $NH_3$ gas.

The furnace was evacuated to an order of $10^{-3}$ Torr and heated to 1900° C., and then the pyrolytic boron nitride crucibles each having a total wall thickness of 1 mm were produced at a pressure of 1 Torr and under the conditions as set forth in Table 2. The deposition was changed by varying the molar ratio of the starting gases. Each of the thus produced crucibles was subjected to the following lifetime test which was conducted to simulate the operations for growing a single crystal by the Liquid Encapsulated Czochralski method, similarly as in Examples 1 to 5.

As will be apparent from the results shown in Table 2, the crucibles of the invention had considerably longer lifetimes as compared with those of the Comparative Examples such that the lifetimes of the crucibles of the invention were more than 20 cycles.

TABLE 2

| Run No. | First Wall Layer Molar Ratio of $NH_3/BCl_3$ | Thickness (micron) | Second Wall Layer Molar Ratio of $NH_3BCl_3$ | Thickness (micron) | Lifetime of Crucible |
|---|---|---|---|---|---|
| Example 7 | 2 | 25 | 1 | 5 | 30 cycles |
| Example 8 | 10 | 25 | 1 | 5 | 32 cycles |
| Example 9 | 3.5 | 100 | ½ | 2 | 24 cycles |
| Example 10 | 3.5 | 20 | 1.8 | 5 | 38 cycles |
| Example 11 | 5 | 50 | 1 | 5 | 40 cycles |
| Com. Ex. 8 | 3.5 | 18 | 2.5 | 5 | Deep cracking formed at 12th cycle |
| Com. Ex. 9 | 3.5 | 25 | 2.5 | 0.4 | Deep cracking formed at 13th cycle |
| Com. Ex. 10 | 3.5 | 110 | ½ | 10 | Delaminated at the initial stage |
| Com. Ex. 11 | 3.5 | 50 | 1.5 | 30 | Deep cracking formed at 12th cycle |
| Com. Ex. 12 | Commercially Available Crucible (Single Wall Structure) | | | | 15 cycles |

Example 12 and Comparative Examples 13 and 14

Generally following the procedures as described in Example 7, ten pyrolytic boron nitride crucibles (Example 12) each having a diameter of 3.49 cm and a height of 4.13 cm were produced. Ten double-wall crucibles (Comparative Example 13) each having a 0.4 mm thick inner wall layer and a 0.6 mm thick outer wall layer and ten single-wall crucibles (Comparative Example 14) each having a 1 mm thick single wall layer were produced. Each of the thus produced crucibles was subjected to a lifetime test which was conducted by melting 20 cc of aluminum therein and then cooling the same. All ten crucibles of Example 12 had lifetimes of more than 8 cycles. In contrast thereto, six crucibles of Comparative Example 13 were broken by 3 cycles, and all crucibles of Comparative Example 13 had been broken at the seventh cycle. Nine crucibles of Comparative Example 14 were broken at the first cycle, and the remaining one crucible was broken at the second cycle.

Although the present invention has been described with reference to the specific examples, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A pyrolytic boron nitride crucible having a multi-walled structure comprising at least five pyrolytic boron nitride wall layers, the thickness of each of first pyrolytic boron nitride wall layers being 5 to 100 microns, the thickness of each second pyrolytic boron nitride wall layers being 1/1 of that of the first wall layer, the total thickness of the entire wall layers being 0.5 to 3 mm, and said first wall layer being bonded to and laminated alternately with said second wall layer, whereby the peeling of one wall layer is prevented from affecting the other wall layers so that the peeling of one wall layer is not propagated into the adjacent layer.

2. The pyrolytic boron nitride crucible according to claim 1, wherein the thickness of each of said wall layers is 20 to 100 microns.

* * * * *